(12) United States Patent
Kobayashi

(10) Patent No.: US 9,117,996 B2
(45) Date of Patent: Aug. 25, 2015

(54) PIEZOELECTRIC VIBRATOR, OSCILLATOR, ELECTRONIC APPARATUS AND RADIO TIMEPIECE

(71) Applicant: SII Crystal Technology Inc., Chiba (JP)

(72) Inventor: Takashi Kobayashi, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 231 days.

(21) Appl. No.: 14/024,874

(22) Filed: Sep. 12, 2013

(65) Prior Publication Data

US 2014/0077663 A1 Mar. 20, 2014

(30) Foreign Application Priority Data

Sep. 20, 2012 (JP) ................................ 2012-207260

(51) Int. Cl.
| | |
|---|---|
| H03H 9/21 | (2006.01) |
| H01L 41/08 | (2006.01) |
| H01L 41/053 | (2006.01) |
| H03H 9/10 | (2006.01) |

(52) U.S. Cl.
CPC .............. *H01L 41/08* (2013.01); *H01L 41/053* (2013.01); *H03H 9/1021* (2013.01)

(58) Field of Classification Search
CPC . H03H 9/0504; H03H 9/0519; H03H 9/1021; H03H 9/21
USPC .......................................... 310/370, 344, 348
See application file for complete search history.

(56) References Cited

U.S. PATENT DOCUMENTS

| | | | | |
|---|---|---|---|---|
| 6,541,897 | B2* | 4/2003 | Endoh ............................ | 310/344 |
| 6,812,622 | B2* | 11/2004 | Matsuyama et al. ........... | 310/344 |
| 7,294,951 | B2* | 11/2007 | Oouchi et al. ................. | 310/348 |
| 7,589,458 | B2* | 9/2009 | Aratake ......................... | 310/370 |
| 7,592,741 | B2* | 9/2009 | Tanaya et al. .................. | 310/370 |
| 8,018,126 | B2* | 9/2011 | Umeki et al. .................. | 310/344 |
| 8,214,982 | B2* | 7/2012 | Kobayashi .................... | 29/25.35 |
| 8,933,615 | B2* | 1/2015 | Ueno et al. .................... | 310/370 |
| 2011/0043079 | A1* | 2/2011 | Shirai et al. .................... | 310/365 |
| 2012/0075962 | A1* | 3/2012 | Arimatsu ........................ | 368/47 |
| 2014/0241132 | A1* | 8/2014 | Tamura .......................... | 368/47 |
| 2014/0254328 | A1* | 9/2014 | Tamura .......................... | 368/47 |

FOREIGN PATENT DOCUMENTS

JP    2010-119127 A    5/2010

* cited by examiner

*Primary Examiner* — J. San Martin
(74) *Attorney, Agent, or Firm* — Brinks Gilson & Lione

(57) ABSTRACT

A piezoelectric vibrator including a package having a base member, a lid member forming a cavity with respect to the base member, and a piezoelectric vibrating piece mounted on a mount surface and housed inside the cavity, in which the piezoelectric vibrating piece has a pair of vibrating arm portions and a base portion cantilever-supporting base end portions of the pair of vibrating arm portions and being mounted on the mount surface, a concave portion for avoiding contact with respect to tip portions when the vibrating arm portions are displaced in a thickness direction is formed on the mount surface, contact portions contacted by main surfaces of the vibrating arm portions facing the mount surface, and clearance portions for avoiding contact with at least one edge-line portion of two edge-line portions where the main surface intersects with two side surfaces.

13 Claims, 12 Drawing Sheets

PIEZOELECTRIC VIBRATOR, OSCILLATOR, ELECTRONIC APPARATUS AND RADIO TIMEPIECE

RELATED APPLICATIONS

This application claims benefit of priority under 35 U.S.C. §119 to Japanese Patent Application No. 2012-207260, filed Sep. 20, 2012, the entire content of which is hereby incorporated by reference.

BACKGROUND OF THE INVENTION

1. Field of the Invention

The present invention relates to a piezoelectric vibrator, an oscillator, an electronic apparatus and a radio timepiece.

2. Description of the Related Art

For example, in a cellular phone or portable information terminal devices, a piezoelectric vibrator using crystal and so on is often used as a time source, a timing source of a control signal and the like, a reference-signal source and so on. As this type of piezoelectric vibrator, a tuning-fork type piezoelectric vibrator which is airtightly sealed in a package in which a cavity is formed is known.

In the above package, one substrate in which a concave portion is formed is overlapped on the other substrate and both substrates are bonded to each other, thereby forming a cavity by using the concave portion.

The piezoelectric vibrating piece includes a pair of vibrating arm portions arranged side by side in parallel in a width direction and a base portion cantilever-supporting a base-end portion side of the pair of vibrating arm portions, in which the pair of vibrating arm portions vibrates (swings) close to and away from each other in a width direction from the base-end portion side as an original point at a given frequency.

Incidentally, as cellular phone and portable information terminal devices are becoming small in size in recent years, the piezoelectric vibrating piece is also planned to be further small and thin in size. Accordingly, a clearance between the piezoelectric vibrating piece and a mount surface (inner surface of the package) in a thickness direction is becoming extremely narrow (for example, approximately 20 µm to 100 µm). As a result, when an impact due to falling is added to the piezoelectric vibrator, there is a danger that the vibrating arm portions are displaced (bending deformation) and tip portions of the vibrating arm portions as free ends contact the inner surface of the package. In this case, a crack, a chip and so on may occur at the tip portions of the vibrating arm portions due to an impact at the time of contact, which may cause frequency variation or may cause a breakage of the vibrating arm portions themselves in the worst case.

Accordingly, as countermeasures against the above, it is known that, for example, a concave portion for avoiding the touching between the tip portion of vibrating arm portion and a base member is formed in a portion corresponding to the tip portions of the vibrating arm portions on the mount surface as shown in JP-A 2010-119127 (Patent Document 1).

In Patent Document 1, there is disclosed that, even when the vibration arm portion is displaced in the thickness direction due to the impact such as falling, it is easy to avoid the contact between the tip portion of the vibrating arm portion and the base member as a corner portion (opening edge portion) of the concave portion contacts an intermediate portion of the vibrating arm.

However, there are the following problems in the above related art.

That is, when the piezoelectric vibrating piece is mounted on the mount surface of the base member, the piezoelectric vibrating piece is placed with respect to metal bumps, conductive adhesive and so on applied on the mount surface to be fixed thereon. At this time, mounting is performed so that the piezoelectric vibrating piece is arranged in parallel to the mount surface, however, it has been found that the piezoelectric vibrating piece is actually mounted in a state of being inclined to the mount surface in many cases by being affected by a point that the metal bumps and the conductive adhesive are materials with liquidity, variation in mount conditions, a design error of the piezoelectric vibrating piece, a design error of the base member, specifications of a manufacturing device and so on.

The above points will be explained in more detail with reference to FIG. 17 and FIG. 18.

First, in an ideal case in which the piezoelectric vibrating piece is mounted in parallel to the mount surface of the base member, main surfaces 200a of vibrating arm portions 200 are parallel to the mount surface as shown in FIG. 17, therefore, when the vibrating arm portions 200 are displaced due to an external impact and so on, a line contact between a corner portion 201a of a concave portion 201 and the main surfaces 200a of the vibrating arm portions 200 is possible.

However, as the piezoelectric vibrating piece is mounted in a state of being inclined to some degree as described above, particularly, in a state of being inclined in a width direction of the piezoelectric vibrating piece in many cases, the main surfaces 200a of the vibrating arm portions 200 are actually inclined to the mount surface as shown in FIG. 18. In such case, it is difficult to make a line contact between the corner portion 201a of the concave portion 201 and the main surfaces 200a of the vibrating arm portions 200 when the vibrating arm portions 200 are displaced due to the external impact and so on.

Accordingly, it has been found that only edge-line portions 200b of the vibrating arm portions 200 contact the corner portion 201a of the concave portion 201 and that stress is locally acted on the edge-line portions 200b which are fragile in strength. As a result, a crack, a chip and the like occur in the edge-line portions 200b as the stress is concentrated on the edge-line portions 200b, which leads to reduction of strength and vibration characteristics of the piezoelectric vibrating piece. That is, it is difficult to positively prevent occurrence of a crack, a chip and the like in the piezoelectric vibrating piece at the time of receiving the external impact when there is variation in mounting accuracy of the piezoelectric vibrating piece in related art.

SUMMARY OF THE INVENTION

In order to solve the above problems, an object of the present invention is to provide a piezoelectric vibrator, which is capable of preventing the touching between the piezoelectric vibrating piece and the base member due to the external impact and the like and preventing occurrence of a crack, a chip and the like even when there is variation in mounting accuracy of the piezoelectric vibrating piece to be mounted on the mount surface on the base, and also to provide an oscillator, an electronic apparatus and a radio timepiece having the piezoelectric vibrator.

The present invention provides the following means for solving the above problems.

(1) A piezoelectric vibrator according to an embodiment of the present invention includes a base member, a lid member bonded to the base member in an overlapped state and forming an airtightly-sealed cavity with respect to the base member, and a piezoelectric vibrating piece having a pair of vibrating arm portions and a base portion integrally supporting base end portions of the pair of vibrating arm portions in a length direction, being mounted on a mount surface of the base member inside the cavity, in which a concave portion is formed on the mount surface of the base member at a region facing tip portions of the piezoelectric vibrating piece, and clearance portions eaten in a direction of the base-end portion side are formed at portions corresponding to edge-line portions of the vibrating arm portions in an opening edge portion arranged on the base-end portion side of the piezoelectric vibrating piece in opening edge portions of the concave portion when seen from a normal-line direction of the mount surface of the base member.

In the piezoelectric vibrator according to an embodiment of the present invention, in the case where an impact due to falling and so on is transmitted to the piezoelectric vibrating piece and the vibrating arm portions are displaced in the thickness direction, the concave portion is formed in the mount surface and the opening edge portion of the concave portion contacts the vibrating arm portions displaced in the thickness direction (portions other than the tip portions), therefore, it is possible to avoid the tip portions of the vibrating arm portions which are liable to be largely displaced from touching the base member and being broken.

Moreover, the clearance portions eaten in the direction of the base-end portion side are formed at portions corresponding to the edge-line portions of the vibrating arm portions when seen from the normal-line direction of the mount surface of the base member. Accordingly, there is no danger that the edge-line portions of the vibrating arm portions contact the opening edge portion of the concave portion when the piezoelectric vibrating piece is displaced in the thickness direction in a state where the piezoelectric vibrating piece is mounted in an inclined state in the width direction. That is, occurrence of a crack, a chip and so on in the edge-line portions can be prevented as stress is not concentrated on the edge lines as in related art. Therefore, the strength and vibration characteristics of the piezoelectric vibrating piece can be improved.

Note that, the "portions corresponding to the edge-line portions of the vibrating arm portions" referred to in this case indicate portions intersecting with the edge-line portions of the vibrating arm portions when seen from the normal-line direction of the mount surface and neighboring portions thereof. That is, the portions indicate regions through which the edge-line portions pass when displaced in the thickness direction of the vibrating arm portions. Moreover, the edge-line portions referred to in this case include at least the edge-line portions facing the mount surface in plural edge-line portions included in the vibrating arm portions.

Accordingly, it is possible to suppress occurrence of a crack, a chip and so on not only in the tip portions but also in the edge-line portions of the vibrating arm portions, therefore, unintended frequency variation of the piezoelectric vibrating piece can be prevented and the piezoelectric vibrator having high performance and impact resistance while securing good vibration characteristics can be provided.

(2) In the piezoelectric vibrator according to the embodiment, it is preferable that the clearance portions are formed so as to correspond to respective edge-line portions of the pair of vibrating arm portions.

In this case, as the clearance portions are formed so as to correspond to respective edge-line portions, the contact between the edge-line portions and the opening edge portion can be avoided and the occurrence of a crack, a chip and the like can be easily suppressed even when the piezoelectric vibrating piece is mounted on the mount surface in a state of being inclined to either side in the width direction. Therefore, it is possible to increase the efficiency in the work of mounting the piezoelectric vibrating piece.

(3) In the piezoelectric vibrator according to the embodiment, it is preferable that the clearance portions and the concave portion are the formed to be approximately the same depth.

In this case, as the clearance portions and the concave portion can be formed simultaneously and easily by using a pressing machine or the like, the clearance portions and the concave portion can be formed in a simple process and the clearance portions with a refined shape can be easily formed with accuracy.

(4) An oscillator according to an embodiment of the present invention includes the piezoelectric vibrator according to the embodiment of the present invention which is electrically connected to an integrated circuit as a resonator.

(5) An electronic apparatus according to an embodiment of the present invention includes the piezoelectric vibrator according to the embodiment of the present invention which is electrically connected to a timer unit.

(6) A radio timepiece according to an embodiment of the present invention includes the piezoelectric vibrator according to the embodiment of the present invention which is electrically connected to a filter unit.

As the oscillator, the electronic apparatus and the radio timepiece according to the embodiment of the present invention include the above-described piezoelectric vibrator, therefore, the performance and the impact resistance can be increased in the same manner.

According to the embodiment of the present invention, it is possible to provide the piezoelectric vibrator, which is capable of preventing the touching between the piezoelectric vibrating piece and the base member due to the external impact and so on and preventing occurrence of a crack, a chip and the like even when there is variation in mounting accuracy of the piezoelectric vibrating piece to be mounted on the mount surface on the base, and also to provide the oscillator, the electronic apparatus and the radio timepiece including the piezoelectric vibrator.

DETAILED DESCRIPTION OF THE PREFERRED EMBODIMENTS

Figure 1:
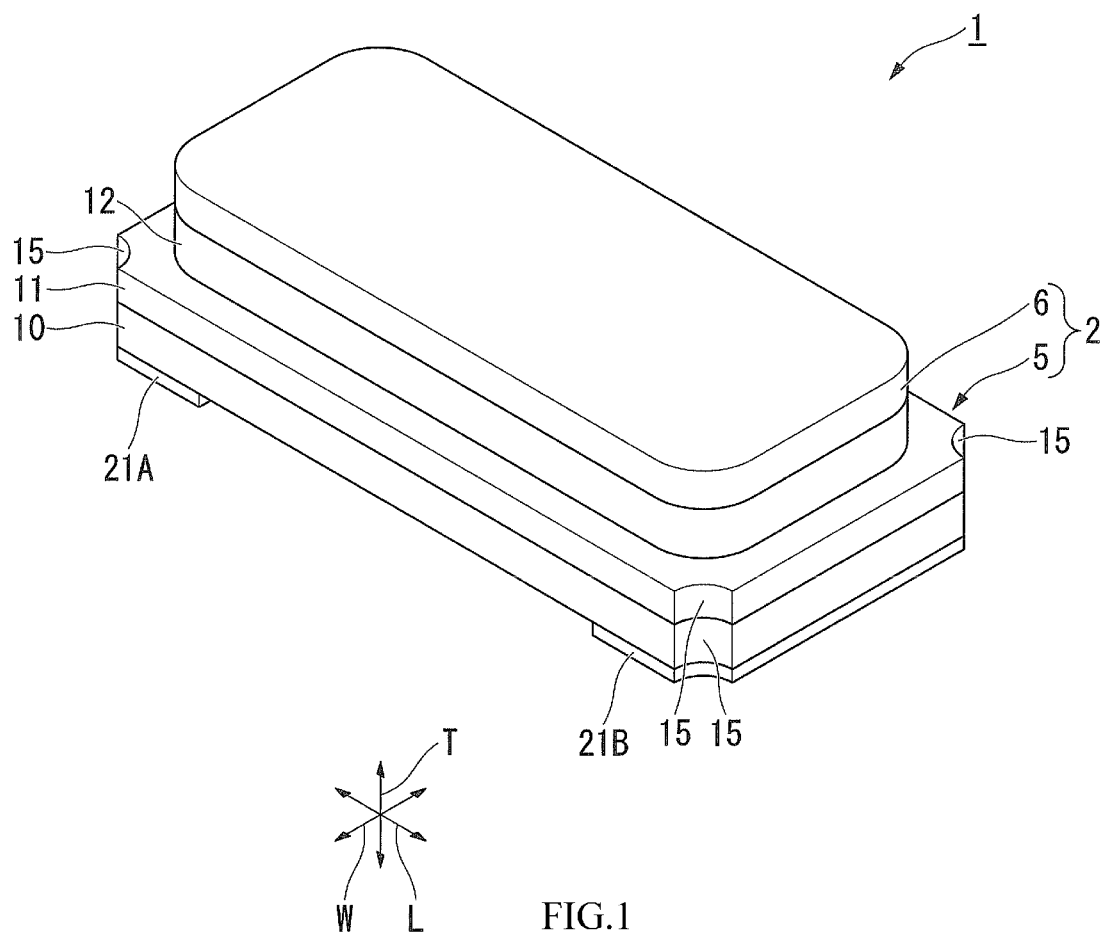
FIG. 1 is an external perspective view of a piezoelectric vibrator according to an embodiment of the present invention.

Hereinafter, a piezoelectric vibrator according to an embodiment of the present invention will be explained with reference to the drawings.

(Structure of Piezoelectric Vibrator)

As shown in FIG. 1 to FIG. 4, a piezoelectric vibrator 1 according to the embodiment is a surface-mount type vibrator as a ceramic package type including a package 2 having an airtightly-sealed cavity C inside and a tuning-fork type piezoelectric vibrating piece 3 housed inside the cavity C.

The piezoelectric vibrator 1 is formed to have an approximately rectangular parallelepiped shape, in which a longitudinal direction of the piezoelectric vibrator 1 is referred to as a length direction L, a short side direction is referred to as a width direction W and a direction orthogonal to the length direction L and the width direction W is referred to as a thickness direction T in plan view in the embodiment.

The package 2 includes a package body (base member) 5 and a lid member 6 bonded to the package body 5 and forming the cavity C with respect to the package body 5.

The package body 5 includes a first base substrate 10 and a second base substrate 11 which are bonded to each other in an overlapped state, and a seal ring 12 bonded onto the second base substrate 11.

The first base substrate 10 is a substrate made of ceramics formed in an approximately rectangular shape in plan view. The second base substrate 11 is a substrate made of ceramics formed in an approximately rectangular shape in plan view which is the same shape as the first base substrate 10, being integrally bonded by sintering and the like in an overlapped state on the first base substrate 10.

In four corners of the first base substrate 10 and the second base substrate 11, notch portions 15 having a ¼ arc shape in plan view are formed over the whole thickness direction T of both substrates 10 and 11. The first base substrate 10 and the second base substrate 11 are formed by, after overlapping two ceramic substrates in a wafer shape and bonding them to each other, forming plural through holes penetrating both ceramic substrates in a matrix state, then, cutting both ceramic substrates in a lattice based on respective through holes. At this time, as the through hole is divided into four, the above notch portions 15 are formed.

An upper surface of the second base substrate 11 is a mount surface 11a on which a piezoelectric vibrating piece 3 is mounted.

The first base substrate 10 and the second base substrate 11 are made of ceramics, and as specific ceramic materials, for example, HTTC (High Temperature Co-Fired Ceramic) made of alumina, LTC (Low Temperature Co-Fired Ceramic) made of glass ceramic and so on can be cited.

The seal ring 12 is a conductive frame-shaped member slightly smaller than an outer shape of the first base substrate 10 and the second base substrate 11, which is bonded to the mount surface 11a of the second base substrate 11. Specifically, the seal ring 12 is bonded on the mount surface 11a by baking using brazing materials such as silver brazing, solder and so on, or bonded by welding to a metal bonding layer formed (by using, for example, electrolytic plating and electroless plating as well as deposition, sputtering and so on) on the mount surface 11a.

As materials for the seal ring 12, for example, nickel base alloy and so on can be cited. Specifically, the material can be selected from Kovar, Elinvar, Invar, 42-alloy and so on. Particularly, a material having a thermal expansion coefficient close to the first base substrate 10 and the second base substrate 11 made of ceramics is preferably selected as the material for the seal ring 12. For example, when alumina with a thermal expansion coefficient of $6.8 \times 10^{-6}/°$ C. is used as the first base substrate 10 and the second base substrate 11, it is preferable that Kovar with a thermal expansion coefficient of $5.2 \times 10^{-6}/°$ C. or 42-alloy with a thermal expansion coefficient of 4.5 to $6.5 \times 10^{-6}/°$ C. is used for the seal ring 12.

The rid member 6 is a substrate overlapped on the seal ring 12, which is airtightly bonded to the package body 5 by the bonding to the seal ring 12. Then, space defined by the lid member 6, the seal ring 12 and the mount surface 11a of the second base substrate 11 functions as the cavity C which is airtightly sealed.

As a welding method of the lid member 6, seam welding performed by allowing a roller electrode to touch, laser welding, ultrasonic welding and so on can be cited. In order to perform welding between the lid member 6 and the seal ring 12 more reliably, a bonding layer made of nickel, gold and the like which are conformable to each other is preferably formed at least on a lower surface of the lid member 6 and an upper surface of the seal ring 12 respectively.

Incidentally, a pair of electrode pads 20A and 20B which are connecting electrodes with respect to the piezoelectric vibrating piece 3 are formed on the mount surface 11a of the second base substrate 11 with a gap in the width direction W as well as a pair of external electrodes 21A and 21B are formed on a lower surface of the first base portion 10 with a gap in the length direction L.

The electrode pads 20A, 20B and the external electrodes 21A, 21B are each a single-layer film made of a single metal or a stacked-layer film in which different metals are stacked which are formed by, for example, deposition, sputtering and so on, which are electrically connected to each other.

The above point will be explained in detail.

In the first base substrate 10, one first through electrode 22A electrically connected to one external electrode 21A and penetrating the first base substrate 10 in the thickness direction T is formed. In the second base substrate 11, one second through electrode 23A electrically connected to one electrode pad 20A and penetrating the second base substrate 11 in the thickness direction T is formed. Then, one connecting electrode 24A connecting one first through electrode 22A to one second through electrode 23A is formed between the first base substrate 10 and the second base substrate 11. Accordingly, one electrode pad 20A and one external electrode 21A are electrically connected to each other.

Additionally, in the first base substrate 10, the other first through electrode 22B electrically connected to the other external electrode 21B and penetrating the first base substrate 10 in the thickness direction T is formed. In the second base substrate 11, the other second through electrode 23B electrically connected to the other electrode pad 20B and penetrating the second base substrate 11 in the thickness direction T is formed. Then, the other connecting electrode 24B connecting the other first through electrode 22B to the other second through electrode 23B is formed between the first base substrate 10 and the second base substrate 11. Accordingly, the other electrode pad 20B and the external electrode 21B are electrically connected to each other.

The other connecting electrode 24B is patterned, for example, so as to extend below the seal ring 12 along the seal ring 12 for avoiding a later-described concave portion 40.

(Piezoelectric Vibrating Piece)

The piezoelectric vibrating piece 3 is a tuning-fork type vibrating piece made of piezoelectric materials such as quartz crystal, lithium tantalate and lithium niobate, including a pair of vibrating arm portions 30 and 31 arranged in parallel in the width direction W with tip portions 30a and 31a as free ends, and a base portion 32 cantilever-supporting a base-end portions 30b and 31b side (root side) of the pair of vibrating arm portions 30 and 31 integrally.

The pair of vibrating arm portions 30 and 31 extends along length direction L in a state of having a given arm width in the width direction W respectively, and a not-shown pair of excitation electrodes for vibrating the pair of vibrating arm portions 30 and 31 is formed on outer surfaces thereof. The excitation electrodes are also formed on edge-line portions and side surfaces of the vibrating arm portions 30 and 31. It is also preferable that groove portions extending from the base-end portions 30b and 31b side to the tip portions 30a and 30b side are formed on the outer surfaces of the vibrating arm portions 30 and 31 in order to improve electric-field efficiency and reduce an R-value in the piezoelectric vibrating piece 3.

The base portion 32 cantilever-supports the base-end portions 30b and 31b side of the pair of vibrating arm portions 30 and 31 as described above, and functions as a mount portion used at the time of mounting the piezoelectric vibrating piece 3. Then, a not-shown pair of mount electrodes is formed on an outer surface of the base portion 32 in a state of electrically connecting to the pair of excitation electrodes respectively.

As the piezoelectric vibrating piece 3 having the above structure is mounted through not-shown metal bumps, conductive adhesive and so on, the pair of mount electrodes is electrically connected to the pair of electrode pads 20A and 20B. Accordingly, the piezoelectric vibrating piece 3 is cantilever-supported in a state of being floated from the mount surface 11a of the second base substrate 11 and is electrically connected to the pair of electrode pads 20A and 20B respectively. When a given voltage is applied to the pair of excitation electrodes through the mount electrodes, the pair of vibrating arm portions 30 and 31 vibrates in the direction (width direction W) moving close to and away from each other at a given resonant frequency due to the interaction between these excitation electrodes.

Incidentally, each of the pair of vibrating arm portions 30 and 31 is a vibrating member having a rectangular shape in cross section and extending along the length direction L with a fixed arm width and a fixed thickness, having one main surface (lower surface) 35a facing the mount surface 11a of the second base substrate 11, the other main surface (upper surface) 35b opposite to the one main surface 35a in the thickness direction T and two side surfaces 35c facing in the width direction W.

Accordingly, in portions where one main surface 35a intersects with two side surfaces 35c in each of the vibrating arm portions 30 and 31, two edge-line portions (corner portions) 36 extending over the entire length from the base end portions 30b, 31b to the tip portions 30a, 31a are formed. That is, the pair of vibrating arm portions 30 and 31 has a total of four edge-line portions 36. In particular, the edge-line portions 36 are fragile in strength, therefore, a chip, a crack and the like easily occur due to structural characteristics.

Figure 5:
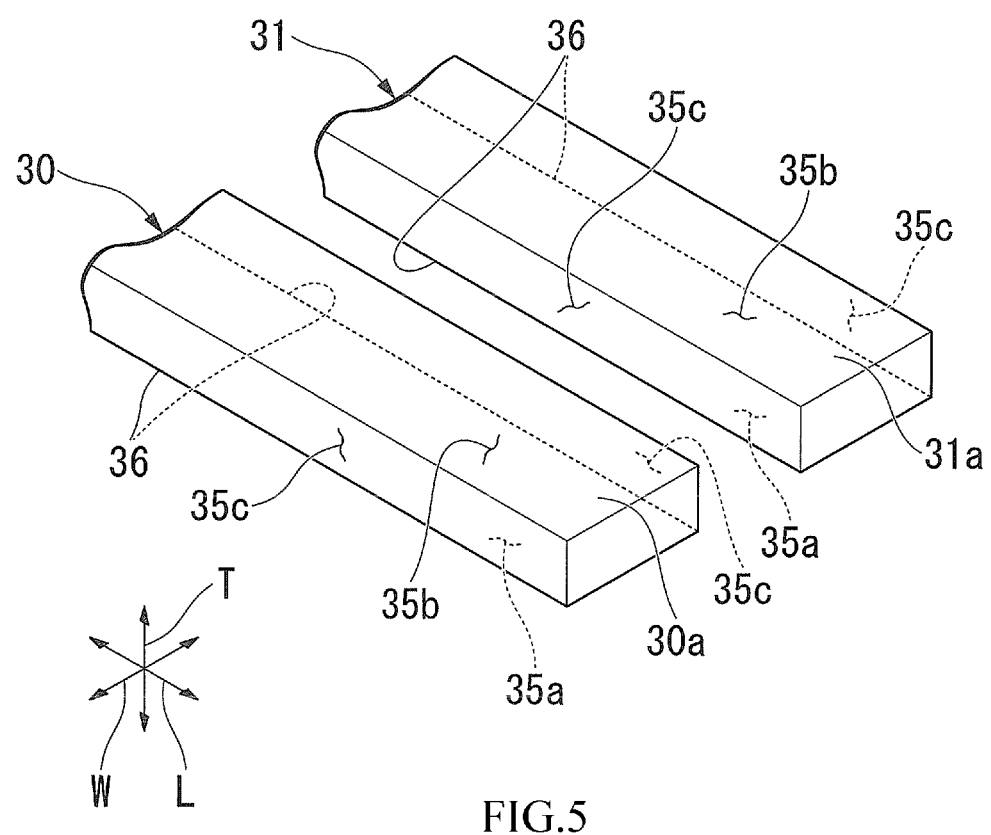
FIG. 5 is an enlarged perspective view of tip portions of vibrating arm portions in a piezoelectric vibrating piece shown in FIG. 4.

Note that reference numerals 35a, 35b and 35c are given only in FIG. 5 for simplifying the drawing.

(Structure of Concave Portion in Package Body)

Figure 2:
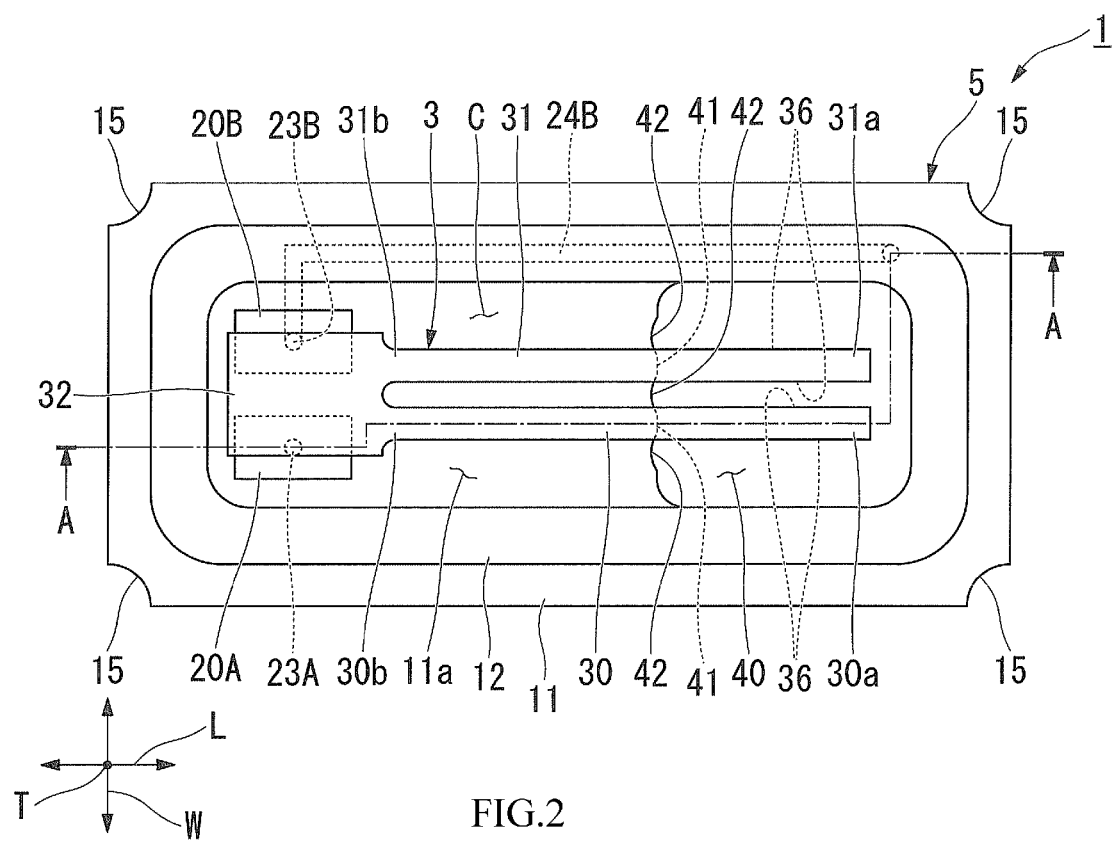
FIG. 2 is an inside structure view of the piezoelectric vibrator shown in FIG. 1.
Figure 3:
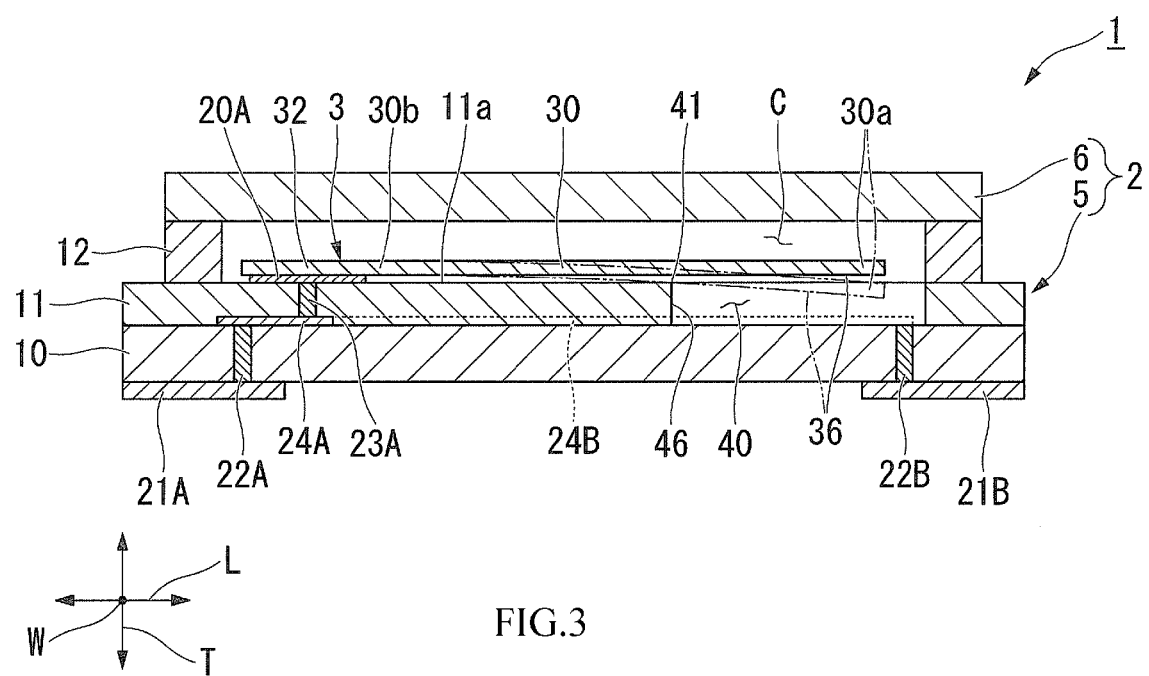
FIG. 3 is a cross-sectional view of the piezoelectric vibrator taken along A-A line of FIG. 2.
Figure 4:
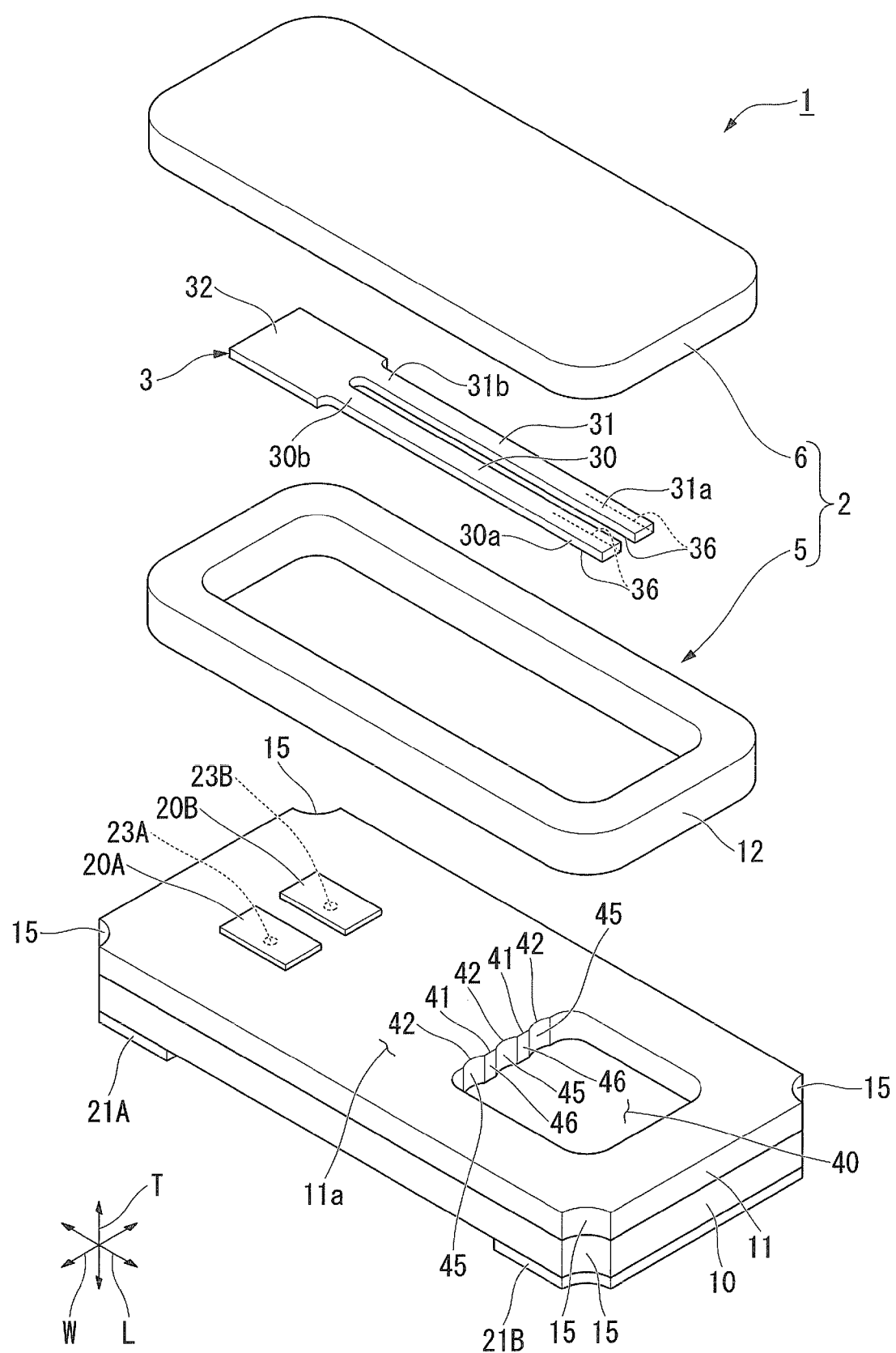
FIG. 4 is an exploded perspective view of the piezoelectric vibrator shown in FIG. 1.

As shown in FIG. 2 to FIG. 4, in the mount surface 11a of the second base substrate 11, the concave portion 40 is provided at a region facing the tip portions 30a and 31a of the pair of vibrating arm portions 30 and 31, which is for avoiding contact of the tip portions 30a and 31a of the vibrating arm portions 30 and 31 occurring when the vibrating arm portions 30 and 31 are displaced (bending deformation) in the thickness direction T (a state indicated by a dotted line shown in FIG. 3) due to an external impact such as falling. The concave portion 40 is a through hole penetrating the second base substrate 11 as well as formed to have a square shape with rounded four corners in plan view inside the seal ring 12.

The concave portion 40 opens to the cavity C side. In an opening edge portion positioned on the base-end portion side of the piezoelectric vibrating piece 3 in opening edge portions, contact portions 41 contacted by one main surfaces 35a and clearance portions 42 for avoiding contact with the four edge-line portions 36 when the pair of vibrating arm portions 30 and 31 are displaced in the thickness direction T are respectively formed.

Figure 6:
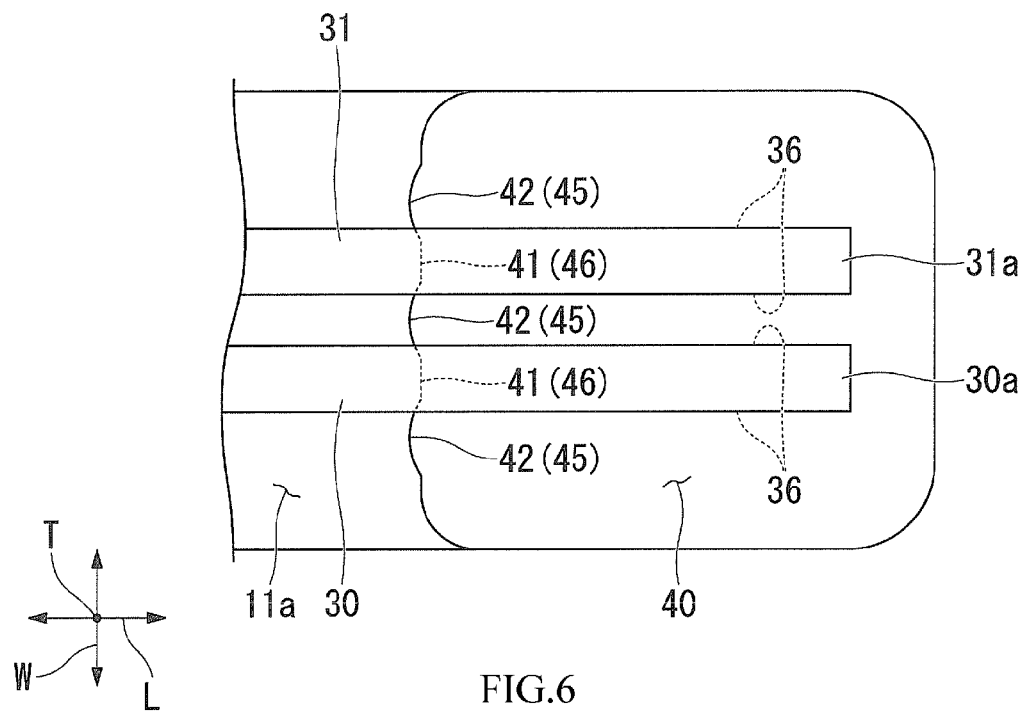
FIG. 6 is an upper surface view shown by enlarging the periphery of a concave portion shown in FIG. 2.
Figure 7:
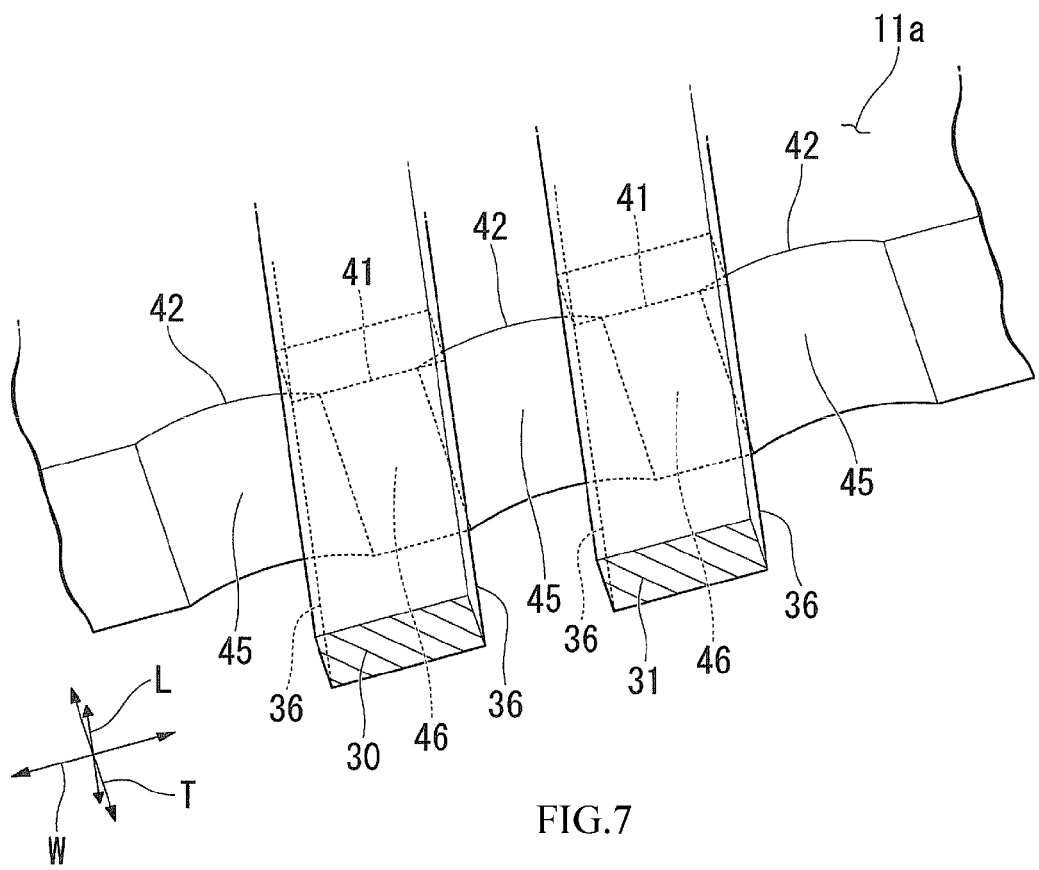
FIG. 7 is an enlarged perspective view showing the relation between the vibrating arm portions and the concave portion shown in FIG. 6.

Specifically, as shown in FIG. 6 and FIG. 7, three clearance portions 45 which are concavely formed (eaten) from the tip portions 30a and 31a side of the vibrating arm portions 30 and 31 toward the base-end portions 30b and 31b side are formed at intervals in the width direction W in the opening edge portion positioned on the base-end portion side of the piezoelectric vibrating piece 3 in a peripheral wall of the concave portion 40. Each of respective clearance portions 45 is formed in the same depth as the concave portion 40 and is integrally formed with the concave portion 40 in a concave state to have an arc or scallop shape in plan view.

The clearance portion 45 positioned at the center of the width direction W in these three clearance portions 45 is formed at a portion corresponding to the edge-line portions 36 positioned inside in the width direction W (a lower position of the edge-line portions 36) in the pair of vibrating arm portions 30 and 31, and the remaining two clearance portions 45 are formed at portions corresponding to the edge-line portions 36 positioned outside in the width direction W in the pair of vibrating arm portions 30 and 31. Here, the "portions corresponding to the edge-line portions" indicate portions intersecting with the vibrating arm portions 30 and 31 and neighboring portions thereof when seeing the edge-line portions 36 from a normal-line direction of the mount surface. In other words, the portions indicate intersecting portions between the opening edge portion and regions through which the edge-line portions pass at the time of displacement. In further other words, the portions indicate lower portions of the edge-line portions (and neighboring portions thereof).

That is, the clearance portions 42 are formed so as to correspond to respective edge-line portions 36 in a manner of avoiding contact with the total of four edge-line portions 36 included in the pair of vibrating arm portions 30 and 31. The clearance portion 42 positioned at the center of the width direction W is a common clearance portion for avoiding contact with two edge-line portions 36. Though the clearance portions 45 are provided at positions corresponding to all edge-line portions 36 in this case, the number and arrangement of clearance portions 45 are not limited to this.

(Operation of Piezoelectric Vibrator)

When the piezoelectric vibrator 1 having the above structure is activated, a given drive voltage is applied to external electrodes 21A and 21B formed in the first base substrate 10. Accordingly, it is possible to allow electric current to flow in the excitation electrodes of the piezoelectric vibrating piece 3, which can vibrate the pair of vibrating arm portions 30 and 31 in a direction moving close to or away from each other at a predetermined frequency. Additionally, the piezoelectric vibrator 1 can be used as a time source, a timing source of a control signal, a reference-signal source and so on by utilizing the vibration of the pair of vibrating arm portions 30 and 31.

Additionally, in the piezoelectric vibrator 1 according to the embodiment, even when an external impact due to falling and so on is transmitted to the piezoelectric vibrating piece 3 and the vibrating arm portions 30 and 31 are displaced in the thickness direction T, the displacement of the piezoelectric vibrating piece 3 is absorbed by the opening edge portion of the concave portion 40 as the concave portion 40 is formed on the mount surface 11a of the package body 5, and it is possible to avoid the tip portions 30a and 31a of the vibrating arm portions 30 and 31 which are liable to be largely displaced from contacting the package body 5. Moreover, the contact portions 41 and the clearance portions 42 are respectively formed in the opening edge portion of the concave portion 40, therefore, it is possible to allow one main surfaces 35a of the vibrating arm portions 30 and 31 to contact the contact portions 41 while avoiding contact with respect to the edge-line portions 36 which are fragile in strength by utilizing the clearance portions 42 when the vibrating arm portions 30 and 31 are displaced in the thickness direction T. At this time, it is possible to allow only portions apart from the edge-line portions 36 in one main surfaces 35a (vicinities of the center in the width W) to contact the contact portions, not allowing one main surfaces 35a to contact the contact portions across the entire width.

Accordingly, the displacement of the vibrating arm portions 30 and 31 can be absorbed by the contact with respect to the contact portions 41 and thus converges smoothly while suppressing occurrence of a crack, a chip and the like not only at the tip portions but also the edge-line portions 36 in the piezoelectric vibrating piece 3, therefore, excessive displacement of the tip portions 30a and 31a can be prevented as well as the vibrating arm portions 30 and 31 can be smoothly restored to an original state.

In particular, even when the piezoelectric vibrating piece 3 is mounted on the mount surface 11a in an inclined state to some degree, the occurrence of a crack, a chip and so on can be suppressed as the contact with respect to the edge-line portions 36 can be avoided by utilizing the clearance portions 42.

As a result, it is possible to obtain the piezoelectric vibrator 1 capable of preventing unintended frequency variation and so on of the piezoelectric vibrating piece 3 and having high performance and impact resistance while securing good vibration characteristics.

In addition, as the clearance portions 42 are formed so as to correspond to all respective edge-line portions 36 which are four in total, the contact of the edge-line portions 36 can be avoided even when the piezoelectric vibrating piece 3 is mounted on the mount surface 11a in a state of being inclined to either side in the width direction W, which can easily suppress occurrence of a crack, a chip and so on. Accordingly, it is possible to efficiently prevent frequency variation and the like of the piezoelectric vibrating piece 3 and the work of mounting the piezoelectric vibrating piece 3 can be easily performed.

Modification Example

Figure 8:
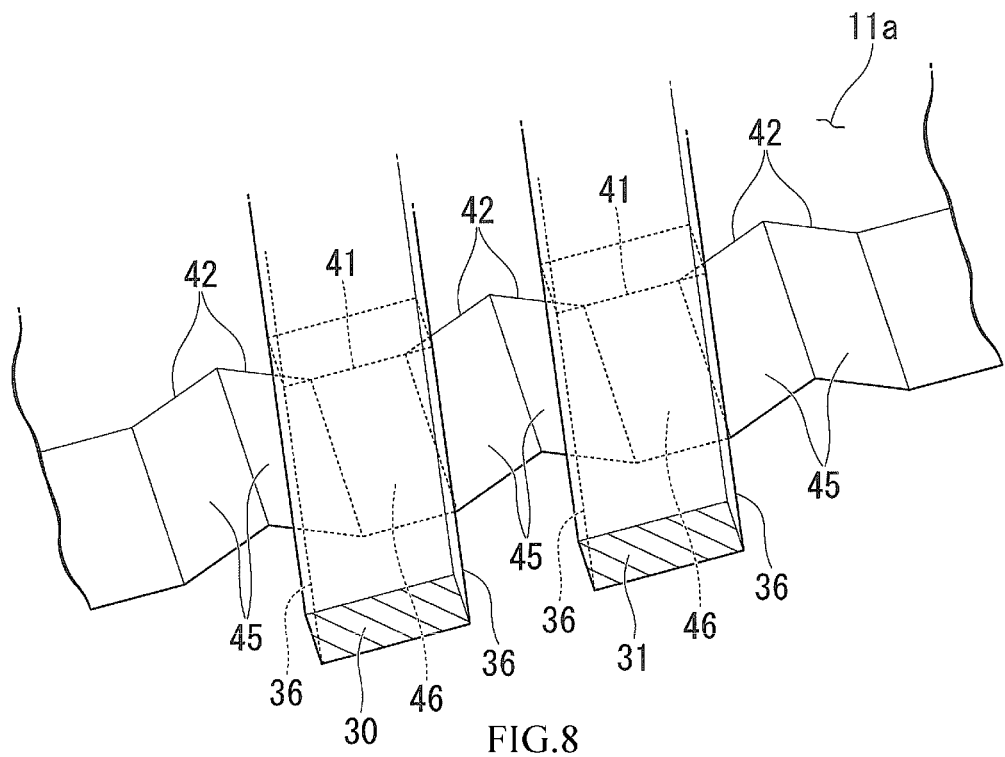
FIG. 8 is a view showing a modification example of clearance portions formed in an opening edge portion of the concave portion.
Figure 9:
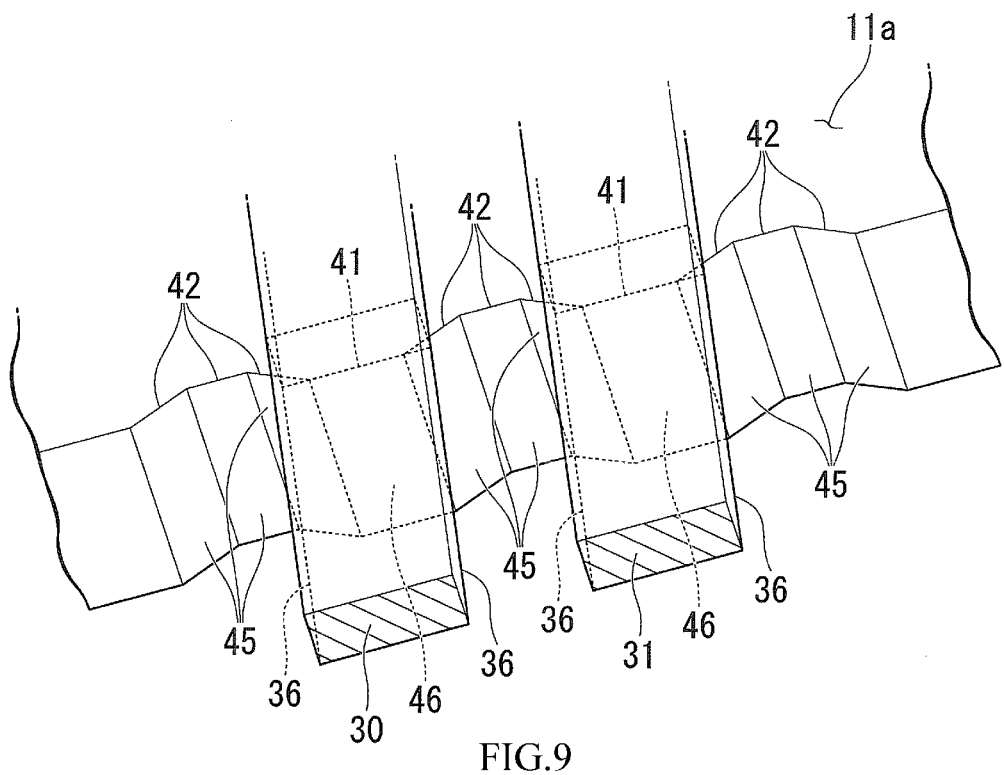
FIG. 9 is a view showing a modification example of clearance portions formed in the opening edge portion of the concave portion.

In the above embodiment, the clearance portions 42 which are concave to have an arc shape in plan view, however, the shape of the clearance portions 42 is not limited to the arc shape in plan view. For example, the clearance portion 42 may be formed to have a V-shape in plan view as shown in FIG. 8 as well as to have a trapezoid-shape in plan view as shown in FIG. 9. Other shapes can be also applied. The same operation and effect can be obtained in these cases.

Figure 10:
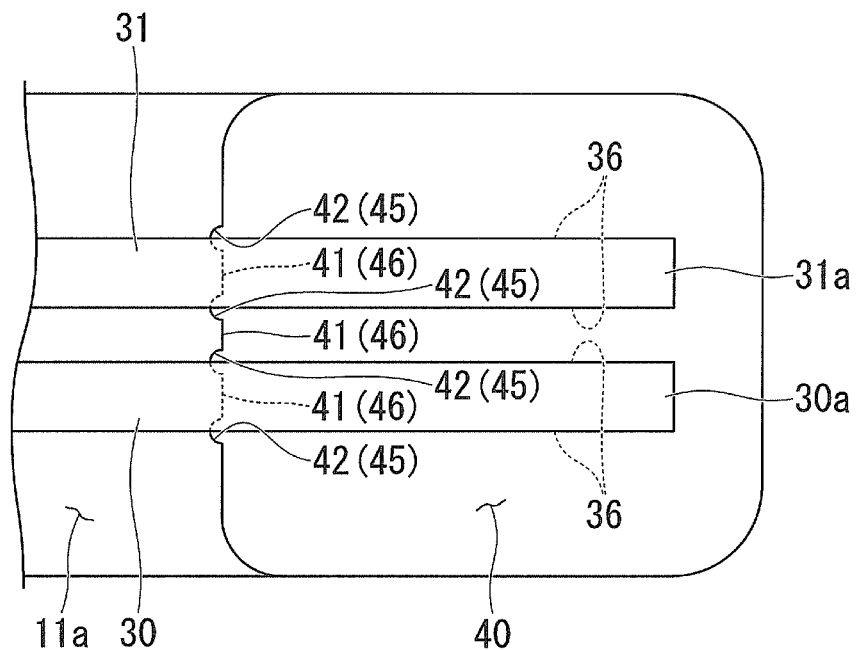
FIG. 10 is a view showing a modification example of clearance portions formed in the opening edge portion of the concave portion.

Although the clearance portions 42 corresponding to all four edge-line portions 36 are formed by forming three clearance portions 42 in the above embodiment, it is not limited to this, and it is also possible to form the clearance portions 42 corresponding to all four edge-line portions 36, for example, by forming four clearance portions 42 as shown in FIG. 10.

The clearance portions 42 are formed so as to corresponding to the total four edge-line portions 36 in the above embodiment, however, it is also preferable to form the clearance portion 42 so as to correspond to at least one edge-line portion 36 in each of the vibrating arm portions 30 and 31.

Figure 11:
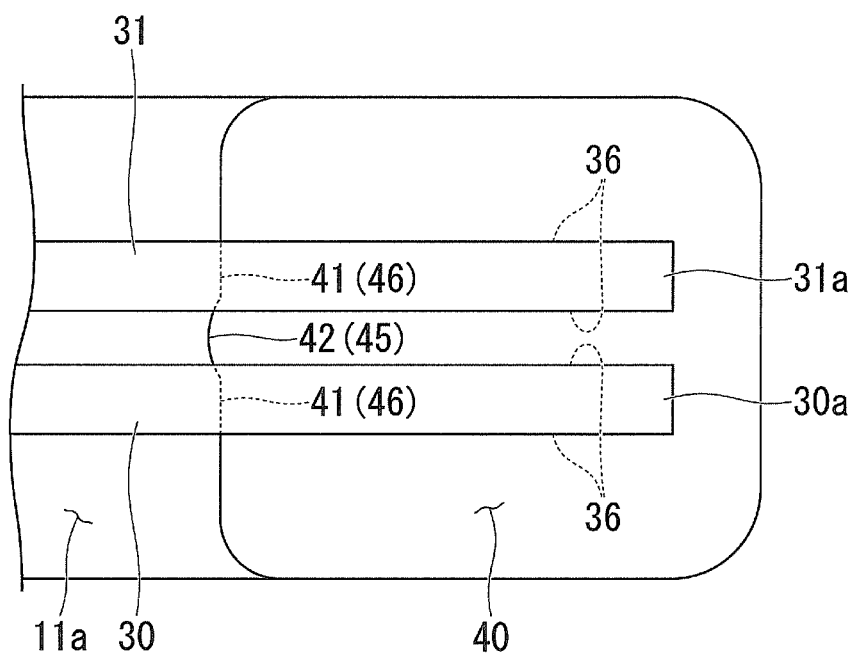
FIG. 11 is a view showing a modification example of clearance portions formed in the opening edge portion of the concave portion.
Figure 12:
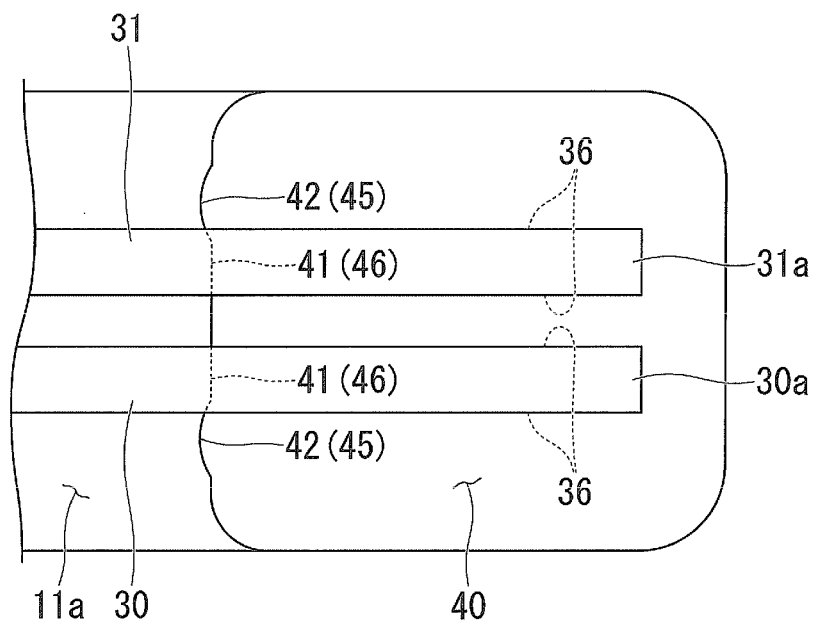
FIG. 12 is a view showing a modification example of clearance portions formed in the opening edge portion of the concave portion.

For example, it is possible to form only one clearance portion 42 as shown in FIG. 11 to thereby avoid contact with the edge-line portions 36 positioned inside in the width direction in respective vibrating arm portions 30 and 31, or it is possible to form two clearance portions 42 as shown in FIG. 12 to thereby avoid contact with the edge-line portions 36 positioned outside in the width direction in respective vibrating arm portions 30 and 31.

However, it is preferable to form the clearance portions 42 so as to correspond all four edge-line portions 36 as in the above embodiment.

Additionally, the concave portion 40 and the clearance portions 42 are integrally formed in the above embodiment, however, it is not limited to this. It is also preferable that the clearance portions 42 are formed by, for example, performing deep groove milling of the mount surface 11a so as to overlap with the opening edge portion of the concave portion 40.

However, the concave portion 40 and the clearance portions 42 can be formed simultaneously and easily by performing punching processing of the second base substrate 11 by using a pressing machine and so on in the above embodiment, therefore, the formation of the clearance portions 42 is not troublesome, and further, the clearance portions 42 with a refined shape can be easily formed with accuracy.

The outer shape of the piezoelectric vibrating piece 3 is not limited to the shape of the above embodiment and can be appropriately changed.

For example, it is possible to apply a so-called grooved piezoelectric vibrating piece 3 in which groove portions are formed respectively on one main surfaces 35a and the other main surfaces 35b, a so-called notched piezoelectric vibrating piece 3 in which notches are formed in the vicinity of a connecting portion with respect to the base end portions 30b and 31b of the pair of the vibrating arm portions 30 and 31 in the base portion 32 from both side surfaces in the width direction W to the center in the width direction W respectively, and a so-called hammerhead type piezoelectric vibrating piece 3 in which hammer portions with an enlarged width wider than the base end portions 30b and 31b are formed on the tip portions 30a and 31a of the vibrating arm portions 30 and 31.

The excitation electrodes are necessary on the outer surfaces of the vibrating arm portions in any shape of the piezoelectric vibrating piece 3 selected from the above. According to the embodiment of the present invention, even when the excitation electrodes are formed in the edge-line portion of the vibrating arm portions, there is no danger that a fracture and so on occur by the contact between the excitation electrodes and the opening edge portion because the contact between the edge-line portions and the opening edge portion of the concave portion can be avoided. Furthermore, when the piezoelectric vibrating piece is displaced in the thickness direction and the vibrating arm portions contact the opening edge portion, a fracture and so on of the excitation electrode can be positively avoided by allowing the contact portions of the opening edge portion to contact regions where the excitation electrodes are not formed in the vibrating arm portions.

Figure 13:
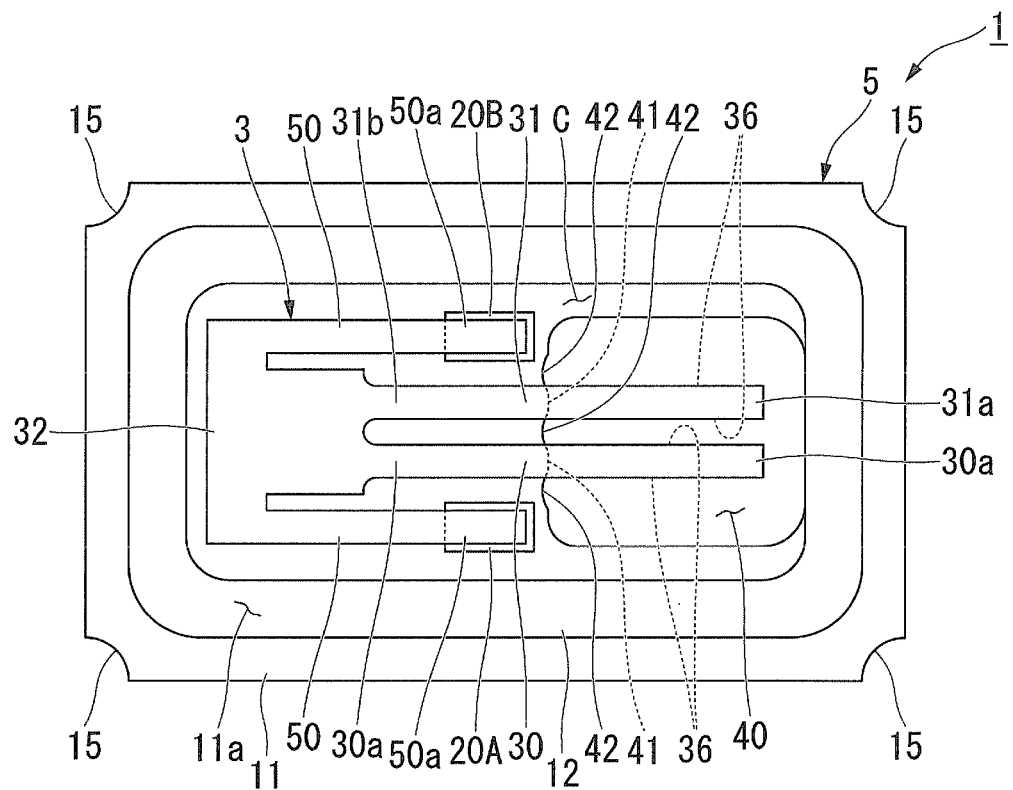
FIG. 13 is a view showing a modification example of the piezoelectric vibrating piece.

Furthermore, as shown in FIG. 13, a side-arm type piezoelectric vibrating piece 3 can be formed, in which a pair of side arms 50 extending along the length direction L are integrally formed with the base portion 32 on both sides of the base portion 32 in the width direction W.

In this case, tip portions 50a of the side arms 50 are allowed to function as mount portions, and the piezoelectric vibrating piece 3 can be mounted through the mount portions by forming the electrode pads 20A and 20B so as to correspond to positions of the tip portions 50a of the side arms 50.

(Oscillator)

Next, an oscillator according to an embodiment of the present invention will be explained with reference to FIG. 14.

Figure 14:
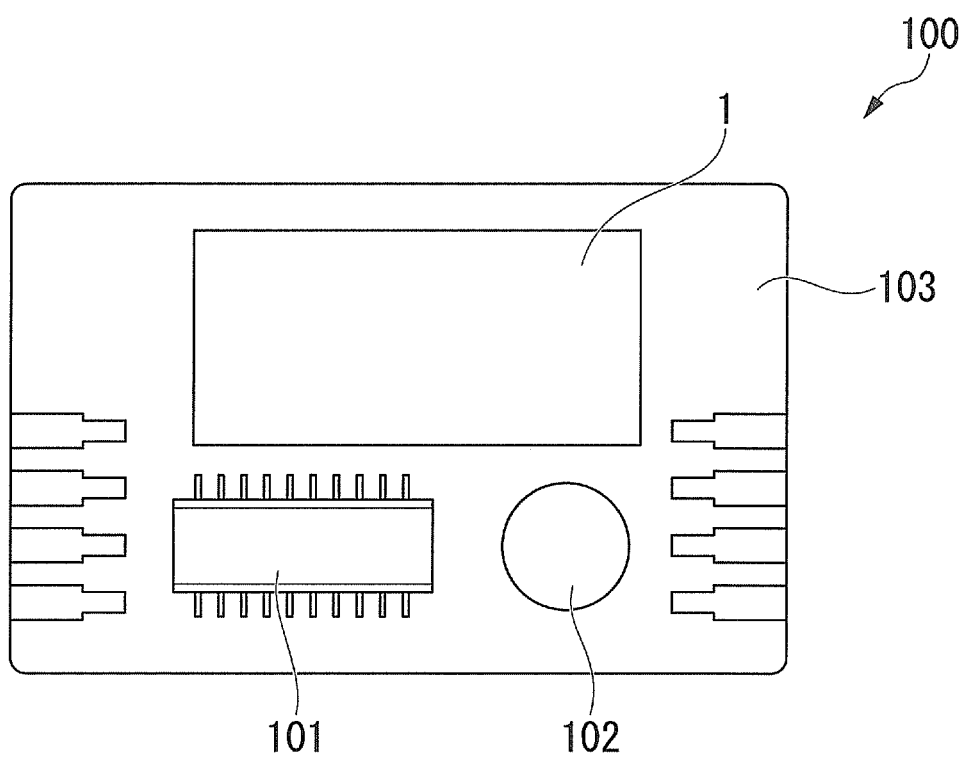
FIG. 14 is a structure view of an oscillator according to an embodiment of the present invention.

An oscillator 100 according to the embodiment uses the piezoelectric vibrator 1 as a resonator electrically connected to an integrated circuit 101 as shown in FIG. 14. The oscillator 100 includes a substrate 103 on which an electronic component 102 such as a capacitor is mounted. The integrated circuit 101 for the oscillator is mounted on the substrate 103 and the piezoelectric vibrator 1 is mounted in the vicinity of the integrated circuit 101. The electronic component 102, the integrated circuit 101 and the piezoelectric vibrator 1 are electrically connected to one another by a not-shown wiring pattern. Note that respective components are molded by a not-shown resin.

In the oscillator 100 having the above structure, when a voltage is applied to the piezoelectric vibrator 1, the piezoelectric vibrating piece 3 inside the piezoelectric vibrator 1 vibrates. The vibration is converted into an electric signal by piezoelectric characteristics possessed by the piezoelectric vibrating piece 3 and inputted into the integrated circuit 101 as the electric signal. Various processing is performed to the inputted electric signal by the integrated circuit 101 and outputted as a frequency signal. Accordingly, the piezoelectric vibrator 1 functions as the resonator.

In the configuration of the integrated circuit 101, for example, an RTC (real time clock) module is selectively set according to a request, thereby adding functions of controlling a single-function oscillator for a timepiece, operation dates, time of the device or external devices, as well as providing time, a calendar and so on.

As described above, the oscillator 100 according to the embodiment includes the above-described piezoelectric vibrator 1, therefore, the oscillator 100 having improved performance and impact resistance can be obtained in the same manner.

(Electronic Apparatus)

Figure 15:
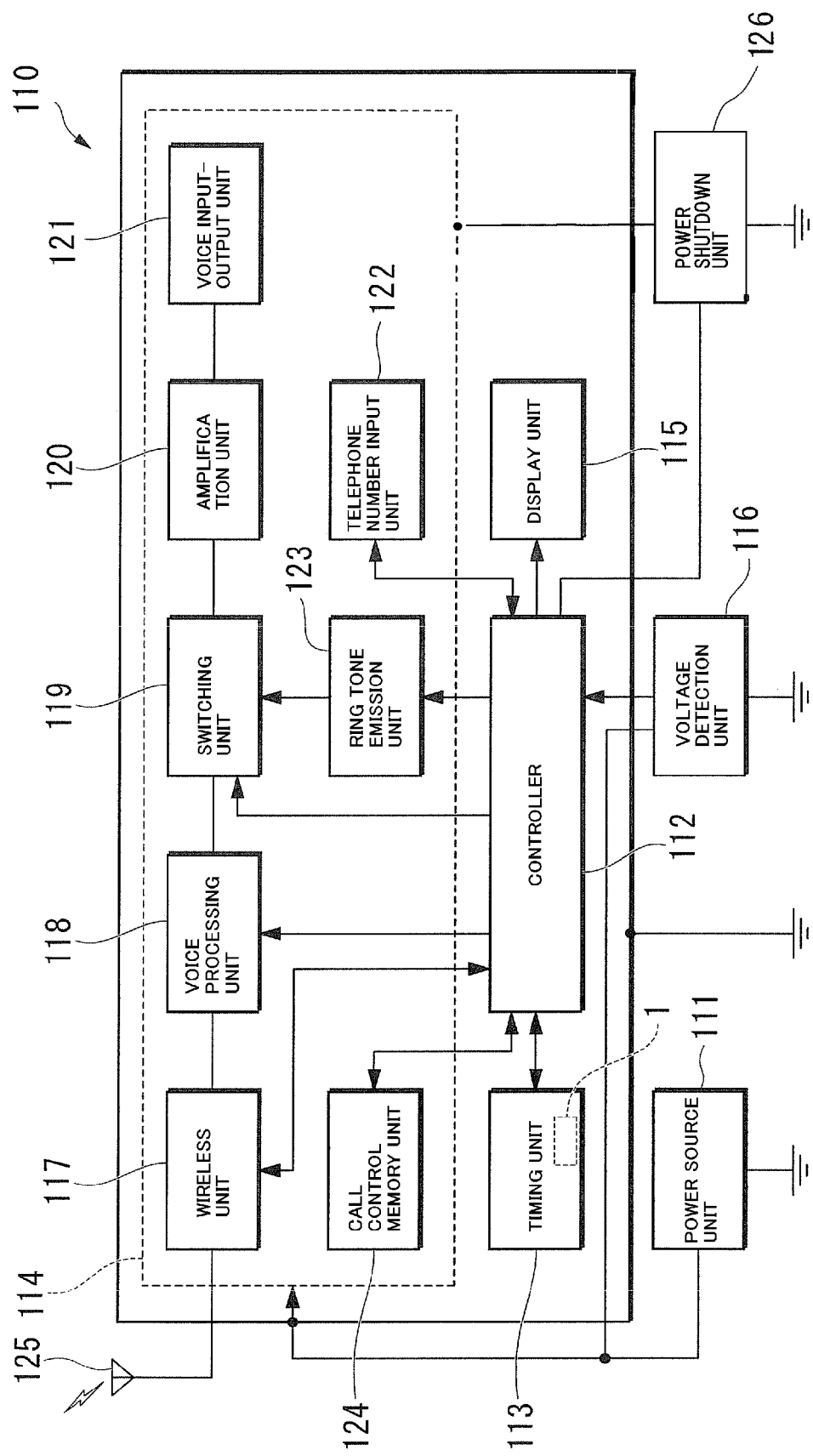
FIG. 15 is a structure view of an electronic apparatus according to an embodiment of the present invention.

Next, an electronic apparatus according to an embodiment of the present invention will be explained with reference to FIG. 15. The explanation will be made by citing a portable information device 110 including the above piezoelectric vibrator 1 as an example of the electronic apparatus.

Here, the portable information device 110 according to the embodiment is typified by a cellular phone, which is obtained by developing and improving a wrist watch in related art. An appearance of the device is analogous to a wrist watch, and a liquid crystal display is arranged at a portion corresponding to an hour plate to thereby display present time and the like on a screen thereof. When using the device as a communication tool, communication can be performed similarly as a cellular phone in related art, by removing the device from a wrist and using a speaker and a microphone included in an inside portion of a band. However, size and weight of the device has been drastically reduced as compared with the related-art cellular phone.

Subsequently, a configuration of the portable information device 110 according to the embodiment will be explained. The portable information device 110 includes the piezoelectric vibrator 1 and a power supply unit 111 for supplying electric power as shown in FIG. 15. The power supply unit 111 is formed by, for example, a lithium secondary battery. A control unit 112 performing various control, a timer unit 113 performing counting of time and the like, a communication unit 114 performing communication with the outside, a display unit 115 displaying various information and a voltage detection unit 116 detecting voltages of respective function units are connected in parallel to the power supply unit 111. Then, electric power is supplied to respective function units by the power supply unit 111.

The control unit 112 controls respective function units to control operations in the entire system such as transmission/reception of audio data and measurement/display of present time. The control unit 112 also includes a ROM in which programs are previously written, a CPU reading and executing programs written in the ROM, a RAM used as a work area of the CPU and so on.

The timer unit 113 includes an integrated circuit having an oscillating circuit, a register circuit, a counter circuit, an interface circuit and so on, and the piezoelectric vibrator 1. When the voltage is applied to the piezoelectric vibrator 1, the piezoelectric vibrating piece 3 vibrates, and the vibration is converted into an electric signal by piezoelectric characteristics possessed by quartz crystal to be inputted into the oscillating circuit as the electric signal. An output of the oscillating circuit is binarized and counted by the register circuit and the counter circuit. Then, signal transmission/reception is performed with respect to the control unit 112 through the interface circuit, and present time/present date or calendar information and so on are displayed on the display unit 115.

The communication unit 114 has similar functions as the related-art cellular phone, including a radio unit 117, an audio processing unit 118, a switching unit 119, an amplification unit 120, an audio input/output unit 121, a telephone-number input unit 122, a ring-tone generation unit 123 and a call-control memory unit 124.

The radio unit 117 performs transmission/reception of various data such as audio data with respect to base stations through an antenna 125. The audio processing unit 118 encodes and decodes an audio signal inputted from the ratio unit 117 or the amplification unit 120. The amplification unit 120 amplifies a signal inputted from the audio processing unit 118 or the audio input/output unit 121 to a given level. The audio input/output unit 121 is formed by a speaker, a microphone and the like, amplifying a ring tone or receiver audio as well as collecting audio.

The ring-tone generation unit 123 generates the ring tone in accordance with calling from the base station. Only when receiving a call, the switching unit 119 switches the amplification unit 120 connected to the audio processing unit 118 to the ring-tone generation unit 123, the ring tone generated in the ring-tone generation unit 123 is outputted to the audio input/output unit 121 through the amplification unit 120.

The call-control memory unit 124 stores programs concerning incoming/outgoing call control of communication. The telephone-number input unit 122 has, for example, number keys from "0" to "9" and other keys, and a telephone number of a called party and so on is inputted by pressing these number keys.

When the voltage applied to respective function units such as the control unit 112 by the power supply unit 111 becomes lower than a given value, the voltage detection unit 116 detects the voltage decrease and notifies the control unit 112 of the decrease. The given voltage value set at this time is a value previously set as the minimum voltage necessary for stably operating the communication unit 114, which is for example, approximately 3V. The control unit 112 which has received notification of voltage decrease from the voltage detection unit 116 prohibits operations of the radio unit 117, the audio processing unit 118, the switching unit 119 and the ring-tone generation unit 123. Particularly, stop of the operation of the radio unit 117 having large power consumption is fundamental. Moreover, information indicating that the communication unit 114 is unavailable due to the insufficient remaining amount of a battery is displayed on the display unit 115.

That is, it is possible to prohibit the operation of the communication unit 114 and display the prohibition on the display unit 115 by the voltage detection unit 116 and the control unit 112. The display may be made as a message of characters, or it is also preferable that a cross mark is put as a more intuitive display on a telephone icon displayed on an upper part of a display surface of the display unit 115.

It is possible to stop the function of the communication unit 114 more positively by providing a power-off unit 126 which can selectively power off portions concerning the function of the communication unit 114.

As described above, the portable information device 110 according to the embodiment includes the above-described piezoelectric vibrator 1, therefore, the portable information device 110 having improved performance and impact resistance can be obtained in the same manner.

(Radio Timepiece)

Next, a radio timepiece according to an embodiment of the present invention will be explained with reference to FIG. 16.

Figure 16:
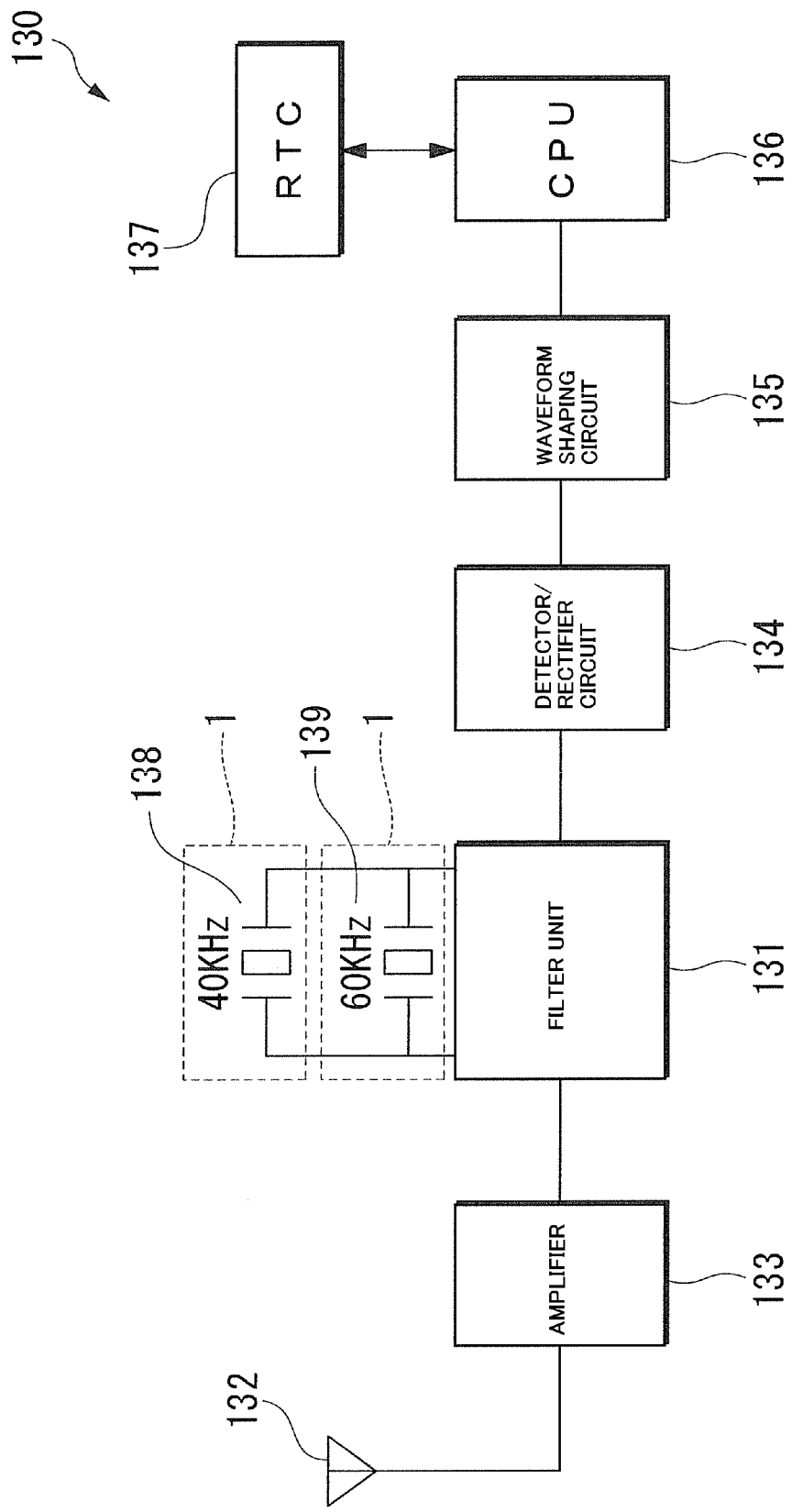
FIG. 16 is a structure view of a radio timepiece according to an embodiment of the present invention.
Figure 17:
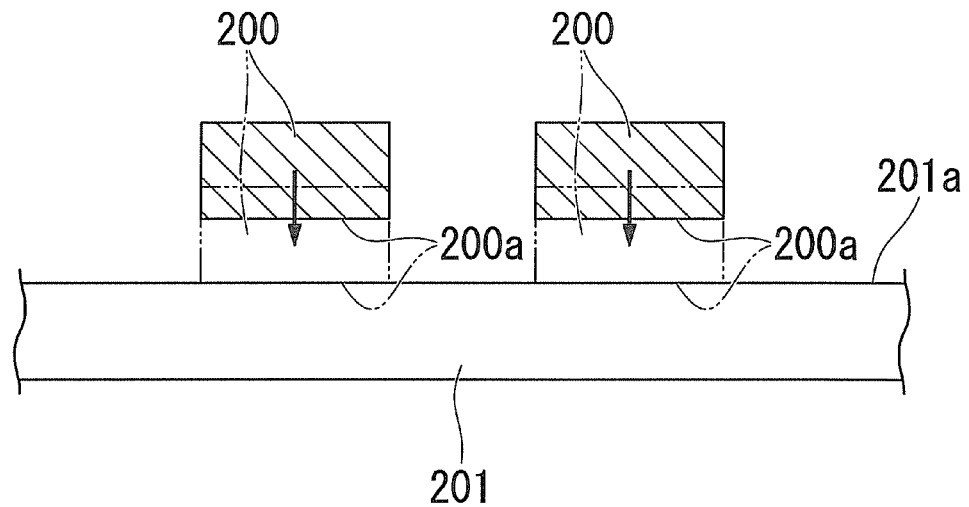
FIG. 17 is a view for explaining a related art.
Figure 18:
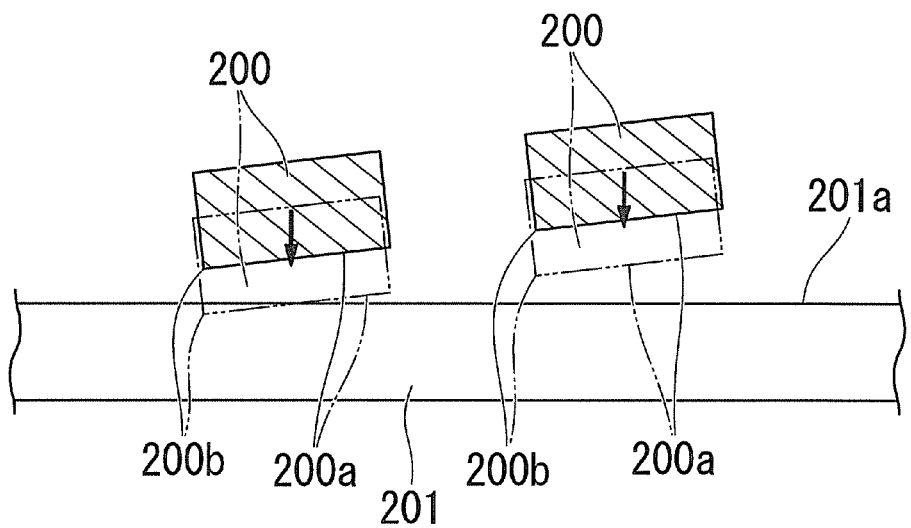
FIG. 18 is a view for explaining the related art.

A radio timepiece 130 according to the embodiment includes the piezoelectric vibrator 1 electrically connected to a filter unit 131 as shown in FIG. 16, which is a timepiece having a function of receiving standard radio waves including timepiece information and displaying accurate time after performing automatic correction.

In Japan, there are transmitting stations (transmitter stations), which transmit standard radio waves, in Fukushima prefecture (40 kHz) and Saga prefecture (60 kHz), and respectively transmit standard radio waves. Since long waves such as 40 kHz or 60 kHz have both a property to propagate the ground surface and a property to propagate while being reflected between an ionized layer and the ground surface, therefore, a wide range of propagation is achieved, so that the above-described two transmitting stations cover the entire part of Japan.

Hereinafter, a functional configuration of the radio timepiece 130 will be explained in detail.

An antenna 132 receives a long-wave standard radio wave of 40 kHz or 60 kHz. The long standard radio wave is time information referred to as a time code and subjected to an AM modulation to a carrier wave of 40 kHz or 60 kHz. The received long standard wave is amplified by an amplifier 133 and is filtered and synchronized by the filter unit 131 having plural piezoelectric vibrators 1.

The piezoelectric vibrators 1 according to the embodiment respectively include quartz vibrator units 138 and 139 having resonant frequencies of 40 kHz and 60 kHz which are the same as the above-described carrier frequencies, respectively.

Moreover, the filtered signal having a given frequency is detected and demodulated by a detection/rectification circuit 134. Subsequently, the time code is acquired through a waveform shaping circuit 135, and counted by a CPU 136. The CPU 136 reads information such as the current year, day of year, day of the week, time of day and the like. The read information is reflected on an RTC 137, and correct time of day information is displayed.

Since the carrier wave has 40 kHz or 60 kHz, vibrators having the above-described turning-fork type structure are suitable for the quarts vibrator units 138 and 139.

The above description is based on an example in Japan, and frequencies of the long standard radio waves are different in foreign countries. For example, in Germany, a standard radio wave of 77.5 kHz is used. Therefore, when the radio timepiece 130 which can be used in the foreign countries is incorporated in a portable apparatus, another piezoelectric vibrator 1 having a frequency different from that in Japan is required.

As described above, the radio timepiece 130 according to the embodiment has the above-described piezoelectric vibrator 1, therefore, the radio timepiece 130 having improved performance and impact resistance can be obtained in the same manner.

Although the embodiments of the present invention have been described as the above with reference to the drawings, the specific structures are not limited to the above embodiments and include design modification and so on not departing from the gist of the invention.

For example, the ceramic-package type piezoelectric vibrator 1 has been cited as an example in the above embodiment, however, it is not limited to this, and for example, a glass-package type piezoelectric vibrator may be applied.

Though the base substrate is formed by two substrates of the first base substrate 10 and the second base substrate 11, it is also preferable that the base substrate is formed by one substrate and the concave portion 40 is formed on the mount surface 11a. However, the structure of two substrates including the first base substrate 10 and the second base substrate 11 is preferable as described above. In this case, the concave portion 40 can be easily formed by forming a through hole in the second base substrate 11, then, by bonding both base substrates to each other, therefore, processes and time to be spent for forming the concave portion can be reduced.

As an additional remark for confirmation, there is no disclosure or suggestion in related art concerning a point of preventing a crack, a chip and so on in the edge-line portions occurring when the piezoelectric vibrating piece is mounted in an inclined state in the width direction. Most of related-art techniques focus attention on a point of preventing a crack, a chip and the like in the tip portions of the piezoelectric vibrating piece, and do not mention a crack, a chip and the like in portions other than the tip portions in the vibrating arm portions. In the case where a crack, a chip and the like in portions other than the tip portions in the vibrating arm portions are mentioned, there is no disclosure or suggestion concerning a problem occurring when the piezoelectric vibrating piece is inclined in the width direction, that is, it is definitely difficult to obtain the above-described significant advantages of the present invention even when adopting the related art.

What is claimed is:

1. A piezoelectric vibrator comprising:
a base member;
a lid member bonded to the base member and defining a sealed cavity therebetween; and
a piezoelectric vibrating piece having a pair of vibrating arms and a base mounted on a mount surface of the base member inside the cavity, the base integrally supporting base ends of the vibrating arms in a length direction, the vibrating arms having tip portions at free ends thereof and edge-line portions at corners thereof extending in the length direction,
the base member including a concave portion in the mount surface facing the tip portions of the vibrating arms, the concave portion having an edge closer to the base ends than remaining edges of the concave portion and clearance portions in the edge proximate to the edge-line portions of the vibrating arms and extending in a direction toward the base ends.

2. The piezoelectric vibrator of claim 1, wherein the edge-line portions of the vibrating arms comprise corners at an intersection of horizontal and vertical sides of the vibrating arms with respect to a normal-line direction of the mount surface.

3. The piezoelectric vibrator of claim 2, wherein the clearance portions reside in regions of the edge through which the edge-line portions pass when the vibrating arm is displaced in the normal-line direction.

4. The piezoelectric vibrator of claim 1, wherein the vibrating arms each include opposing edge-line portions that face the mount surface.

5. The piezoelectric vibrator of claim 4, wherein the clearance portions are proximate to the opposing edge-line portions of the vibrating arms.

6. The piezoelectric vibrator of claim 1, wherein the clearance portions are separated by contact portions in the edge of the concave portion.

7. The piezoelectric vibrator of claim 6, wherein the clearance portions comprises scalloped regions in the edge of the concave portion.

8. The piezoelectric vibrator of claim 6, wherein the contact portions are parallel to a normal-line direction of the mount surface.

9. The piezoelectric vibrator of claim 1, wherein the base comprises a first base substrate and a second base substrate overlying the first base substrate, and wherein the concave portion extends through the second base substrate and exposes an upper surface of the first base substrate.

10. The piezoelectric vibrator of claim 1, wherein the clearance portions extend along the edge of the concave portion from the mount surface of the base member to a same depth in the base member as the concave portion.

11. An oscillator according comprising the piezoelectric vibrator according to claim 1 as a resonator electrically connected to an integrated circuit.

12. An electronic apparatus comprising the piezoelectric vibrator according to claim 1 electrically connected to a timer unit.

13. A radio timepiece comprising the piezoelectric vibrator according to claim 1 electrically connected to a filter unit.

* * * * *